United States Patent [19]

Yamamoto

[11] Patent Number: 4,945,023

[45] Date of Patent: * Jul. 31, 1990

[54] LIGHT-SENSITIVE MATERIAL CONTAINING SILVER HALIDE, REDUCING AGENT AND POLYMERIZABLE COMPOUND WHEREIN THE SILVER HALIDE IS MONODISPERSED

[75] Inventor: Soichiro Yamamoto, Minami-ashigara, Japan

[73] Assignee: Fuji Photo Film Co., Ltd., Kanagawa, Japan

[*] Notice: The portion of the term of this patent subsequent to May 23, 2006 has been disclaimed.

[21] Appl. No.: 24,494

[22] Filed: Mar. 11, 1987

[30] Foreign Application Priority Data

Mar. 11, 1986 [JP] Japan .................................. 61-55508

[51] Int. Cl.$^5$ .......................... G03C 1/68; G03C 1/72
[52] U.S. Cl. ..................................... 430/138; 430/203; 430/253; 430/281; 430/567; 430/569
[58] Field of Search ............... 430/567, 568, 569, 203, 430/253, 138, 281

[56] References Cited

U.S. PATENT DOCUMENTS

| | | |
|---|---|---|
| 868,385 | 3/1878 | Yamamoto et al. . |
| 933,510 | 12/1880 | Nakamura et al. . |
| 3,443,948 | 5/1969 | Bryan ..................................... 430/138 |
| 3,694,252 | 9/1972 | Gerba et al. ........................ 430/138 |
| 3,694,253 | 9/1972 | Gerba et al. ........................ 430/138 |
| 4,461,826 | 7/1984 | Yamashita et al. ................. 430/505 |
| 4,510,234 | 4/1985 | Matsuzaka et al. ................. 430/567 |
| 4,629,676 | 12/1986 | Hayakawa et al. ................. 430/203 |
| 4,833,062 | 5/1989 | Kakimi ................................ 430/138 |

*Primary Examiner*—Paul R. Michl
*Assistant Examiner*—Patrick Doody
*Attorney, Agent, or Firm*—Sughrue, Mion, Zinn, Macpeak & Seas

[57] ABSTRACT

A light-sensitive material comprising a light-sensitive layer which contains silver halide grains, a reducing agent and a polymerizable compound provided on a support, characterized in that the silver halide grains have such a grain size distribution that the coefficient of variation ($\sigma/\bar{r}$) is not more than 20% wherein $\sigma$ means a standard deviation of the grain size and $\bar{r}$ means an average grain size. Image-forming methods employing the light-sensitive material are also disclosed.

14 Claims, No Drawings

LIGHT-SENSITIVE MATERIAL CONTAINING SILVER HALIDE, REDUCING AGENT AND POLYMERIZABLE COMPOUND WHEREIN THE SILVER HALIDE IS MONODISPERSED

BACKGROUND OF THE INVENTION

1. Field of the Invention

This invention relates to a light-sensitive material comprising a light-sensitive layer containing silver halide, a reducing agent and a polymerizable compound provided on a support, and further relates to image-forming methods employing the light-sensitive material.

2. Description of Prior Arts

Light-sensitive materials comprising a light-sensitive layer containing silver halide, a reducing agent and a polymerizable compound provided on a support can be used in an image forming method in which a latent image of silver halide is formed, and then the polymerizable compound is polymerized to form the corresponding image.

Examples of said image forming methods are described in Japanese Patent Publication Nos. 45(1970)-11149 (corresponding to U.S. Pat. No. 3,697,275) 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore, the process takes a relatively long time.

An improved image forming method employing a dry process is described in Japanese Patent Provisional Publication Nos. 61(1986)-69062 and 61(1986)-73145 (the contents of both publications are described in U.S. Pat. No. 4,629,676 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441.

The above-mentioned image forming methods are based on the principle in which the polymerizable compound is polymerized within the area where a latent image of the silver halide has been formed.

Further, Japanese Patent Provisional Publication No. 61(1986)-260241 describes another image forming method in which the polymerizable compound in a portion where a latent image of the silver halide has not been formed is polymerized. In this method, when the material is heated, the reducing agent functions as polymerization inhibitor within the area where a latent image of the silver halide has been formed, and the polymerizable compound in the other portion is polymerized.

SUMMARY OF THE INVENTION

An object of the present invention is to provide a light-sensitive material which gives an image reduced in occurrence of fog.

Another object of the invention is to provide a light-sensitive material which gives a clear image, even if small amount of the silver halide is used.

There is provided by the present invention a light-sensitive material comprising a light-sensitive layer which contains silver halide grains, a reducing agent and a polymerizable compound provided on a support, characterized in that the silver halide grains have such a grain size distribution that the coefficient of variation (in terms of $\sigma/\bar{r}$) is not more than 20%, wherein $\sigma$ means a standard deviation of the grain size and $\bar{r}$ means an average grain size.

The light-sensitive material of the invention can be advantageously used in a process which comprises:

imagewise exposing the light-sensitive material to form a latent image of the silver halide, and heating the light-sensitive material either simultaneously with or after the imagewise exposure to polymerize the polymerizable compound within the area where the latent image of the silver halide has been formed (or the area where the latent image of the silver halide has not been formed).

The light-sensitive material of the invention is characterized in that the silver halide grains have a narrow grain size distribution in which the coefficient of the variation in terms of $\sigma/\bar{r}$ is not more than 20%.

The present inventor has found that the light-sensitive material employing said silver halide grains is reduced in the occurrence of fog and accelerated in the development. Therefore, the light-sensitive material of the invention can form an improved clear image having a high maximum density and a low minimum density.

In the light-sensitive material of the invention, the silver halide grain functions as a photo-sensor, and the grain is imagewise developed to accelerate or inhibit the following polymerization. If the silver halide grains have an excessively broad grain size distribution, a part of the grains can not be smoothly developed in the development process, and thereby the ratio of the grains participating in the development becomes small. Therefore, the silver halide grains having the above narrow grain size distribution can effectively form a polymerization image, even if small amount of the silver halide is used. The above effect in the light-sensitive material of the invention is surprisingly remarkable beyond the knowledge in the conventional photographic system.

DETAILED DESCRIPTION OF THE INVENTION

In the present invention, there is no specific limitation with respect to the halogen composition of the silver halide grain. Examples of the silver halide include silver chloride, silver bromide, silver iodide, silver chlorobromide, silver chloroiodide, silver iodobromide and silver chloroiodobromide in the form of the grains. The halogen composition of individual grains may be homogeneous or heterogeneous.

In the light-sensitive material of the invention, the silver halide grains have a narrow grain size distribution in which the coefficient of variation in terms of $\sigma/\bar{r}$ is not more than 20%, wherein $\sigma$ is the standard deviation of the grain size and r is the average grain size.

The grain size (r) of the silver halide grain can be calculated according to the following formula (I), in which S means the area of the projected image of the silver halide grain.

$$r = 2\sqrt{S/\pi} \qquad (I)$$

Further, the average grain size ($\bar{r}$) of the silver halide grains can be caluculated according to the following formula (II), in which ri is the individual grain size caluculated according to the above formula (I) and n is the number of the caluculated silver halide grains contained in the light-sensitive layer.

$$r = \frac{\sum_{i=1}^{n} ri}{n} \qquad (II)$$

Furthermore, the standard deviation of the grain size ($\sigma$) is defined by the following formula (III).

$$\sigma = \sqrt{\sum_{i=1}^{n} (ri - r)^2/n} \qquad (III)$$

The coefficient of variation ($\sigma/\bar{r}$) in the grain size distribution can be obtained from the average grain size ($\bar{r}$) and the standard deviation ($\sigma$). In the present invention, the coefficient of variation is not more than 20% (0.20), and more preferably not more than 15% (0.15).

Examples of a conventional photographic light-sensitive material and a silver halide emulsion employing the silver halide grains which have the narrow grain size distribution are described in Japanese Patent Provisional Publication Nos. 57(1982)-178235, 58(1983)-100846 and 58(1983)-14829, International Patent Publication No. 83-02330A1, and European Patent Provisional Publication Nos. 64412A3 and 83377A1.

The silver halide grains ordinarily have an average grain size ($\bar{r}$) in the range of 0.001 to 5 μm, more preferably 0.001 to 2 μm.

In the case that the silver halide grains are contained in a microcapusle, the average grain size of silver halide grains preferably is not more than one-fifth of the average size of the microcapsules, more preferably is not more than the one-tenth.

When the grain size of the silver halide becomes larger beyond a certain level, only a small number of the silver halide grains can be incorporated into a microcapsule. Therefore, the numbers of the silver halide grains incorporated into respective individual microcapusles largely varies from each other. As a result, even if the microcapsules are irradiated with same quantity of radiation, it may happen that polymerization occurs in certain microcapsules, while polymerization does not appropriately occur in neighboring other microcapsules. Therefore, excessive variation of the number of silver halide grains among microcapsules is supposed to bring about uneveness (roughness) into the obtained image. It is observed that when the average size of the microcapsules is not less than 5 times as much as the average grain size of silver halide grains, even and uniform image can be obtained.

There is no specific limitation on the crystal habit of the silver halide grain. Two or more kinds of silver halide grains which differ in crystal habit, grain size, and/or other features from each other can be used in combination, so long as the silver halide grains have the above-mentioned grain size distribution.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 1 g/m$^2$, more preferably in the range of from 1 mg to 500 mg/m$^2$.

The silver halide grains can be prepared, for instance by the following process.

The silver halide grain is preferably prepared in the form of a silver halide emulsion. Various processes for the preparation of the silver halide emulsion are known in the conventional technology for the preparation of photographic materials.

The silver halide grains having the above-mentioned grain size distribution can be prepared by adjusting the conditions in the grain formation, such as pH, pAg, temperature, the form and the scale of the reaction vessel and the reaction method. There is no specific limitation with respect to the grain formation of the silver halide grains for the preparation of the light-sensitive material of the invention.

Preparation of a silver halide emulsion containing the silver halide grains which have the narrow grain size distribution is described in Japanese Patent Provisional Publication Nos. 57(1982)-178235, 58(1983)-100846 and 58(1983)-14829, International Patent Publication No. 83-02330A1, and European Patent Provisional Publication Nos. 64412A3 and 83377A1.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added during the preparation of the emulsion.

The reducing agent, the polymerizable compound and the support which constitute the light-sensitive material of the invention with the silver halide grains are stated below. Thus composed material is referred hereinafter to as the "light-sensitive material".

The reducing agent employed in the light-sensitive material has a function of reducing the silver halide and/or a function of accelerating or restraining polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound in either a portion where a latent image of the silver halide has been formed or a portion where a latent image of the silver halide has not been formed can be polymerized. In the developing system in which the polymerizable compound in the portion where the latent image has not been formed is polymerized, 1-phenyl-3-pyrazolidone is preferably employed as the reducing agent.

The light-sensitive materials employing the reducing agent having these functions (including compounds referred to as developing agent or hydrazine derivative) are described in Japanese Patent Provisional Publication Nos. 61(1986)-183640, 61(1986)-188535 and 61(1986)-228441, and Japanese Patent Application Nos. 60(1985)-210657, 60(1985)-226084, 60(1985)-227527 and 60(1985)-227528. These reducing agents are also described in T. James, "The Theory of the Photographic Process", 4th edition, 291-334 (1977), Research Disclosure No. 17029, 9-15 (June 1978), and Research Disclosure No. 17643, 22-31 (Dec. 1978). The reducing agents described in the these publications and applications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Another interaction is for a chain reaction in which an oxidized state of one reducing agent formed by a reduction of silver halide (and/or an organic silver salt) induces or inhibits the polymerization of the polymerizable compound via oxidation-reduction reaction with another reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)butyloyl}-2-(p-or o-aminophenyl)-hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p- or o-methoxyphenyl)hydrazine, 1-(methoxycarbonylbenzohydryl)-2-phenylhydrazine, 1-formyl-2-[4-{2-(2,4-di-tert-pentylphenoxy)-butylamide}phenyl]hydrazine, 1-acetyl- 2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine and 1-trityl-2-[{2-(N-ethyl-N-octylsulfamoyl)-4-methanesulfonyl}phenyl]hydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, and any known polymerizable compounds including monomers, oligomers and polymers can be contained in the light-sensitive layer. In the case that heat development (i.e., thermal development) is utilized for developing the light-sensitive material, the polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

The polymerizable compound employable for the light-sensitive material of the invention are described in the above-mentioned and later-mentioned publications and applications concerning the light-sensitive material.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound, are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

The light-sensitive material of the invention can be prepared by arranging a light-sensitive layer containing the above-mentioned components on a support. There is no limitation with respect to the support. In the case that heat development is utilized in the use of the light-sensitive material, the material of the support preferably is resistant to heat given in the processing stage. Examples of the material employable for the preparation of the support include glass, paper, fine paper, coat paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene).

Various embodiments of the light-sensitive materials, optional components which may be contained in the light-sensitive layer, and auxiliary layers which may be optionally arranged on the light-sensitive materials are described below.

The polymerizable compound is preferably dispersed in the form of oil droplets in the light-sensitive layer. Other components in the light-sensitive layer, such as silver halide, the reducing agent, the color image forming substances may be also contained in the oil droplets.

The oil droplets of the polymerizable compound are preferably prepared in the form of microcapsules. There is no specific limitation on preparation of the microcapsules. There is also no specific limitation on shell material of the microcapsule, and various known materials such as polymers which are employed in the conventional microcapsules can be employed as the shell material. The mean size of the microcapsule preferably ranges from 0.5 to 50 $\mu$m, more preferably 1 to 25 $\mu$m, most preferably 3 to 20 $\mu$m.

The light-sensitive layer can further contain optional components such as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers and binders.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145.

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), 29–58 (pressure-sensitive copying paper), 87–95 (azo-graphy), 118–120 (heat-sensitive color formation by a chemical change) or in MSS. of the seminer promoted by the Society of Kinki Chemical Industry, "The Newest Chemistry of Coloring Matter - Attractive Application and New Development as a Functional Coloring Matter", 26–32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material of the invention. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination.

Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion.

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect.

Various image formation accelerators are employable in the light-sensitive material of the invention. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inorganic bases, organic bases, base precursors, oils, surface active agents, hot-melt solvents, and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The hot-melt solvents preferably are compounds which may be used as a solvent of the reducing agent or those which have high dielectric constant and can accelerate physical development of silver salts. Examples of the hot-melt solvents include polyethylene glycols, derivatives of polyethylene oxides (e.g., oleate ester), beeswax,, monostearin and high dielectric constant compounds having —$SO_2$— and/or —CO— group described in U.S. Pat. No. 3,347,675; polar compounds described in U.S. Pat. No. 3,667,959; and 1,10-decanediol, methyl anisate and biphenyl suberate described in Research Disclosure 26–28 (Dec. 1976). The hot-melt solvent is preferably used in an amount of from 0.5 to 50% by weight, and more preferably from 1 to 20% by weight, based on the total solid content of the light-sensitive layer.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", 6–18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tertbutyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound located in a portion where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are particles which are solid at ambient temperatures. Examples of the antismudging agents include starch particles described in U.K. Patent No. 1,232,347; polymer particles described in U.S. Pat. No. 3,625,736; microcapsule particles containing no color former described in U.K. Patent No. 1,235,991; and cellulose particles, and inorganic particles, such as particles of talc, kaolin, bentonite, agalmatolite, zinc oxide, titanium dioxide or aluminium oxide described in U.S. Pat. No. 2,711,375. Such particles preferably have a mean size of 3 to 50 $\mu$m, more preferably 5 to 40 $\mu$m. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062.

Examples and usage of the other optional components which can be contained in the light-sensitive layer are also described in the above-mentioned publications and applications concerning the light-sensitive material, and in Research Disclosure Vol. 170, No. 17029, 9–15 (June 1978).

Examples of auxiliary layers which are optionally arranged on the light-sensitive material include an image-receiving layer, a heating layer, an antistatic layer, an anticurl layer and a release layer.

Instead of the use of the image-receiving material, the image-receiving layer can be arranged on the light-sensitive material to produce the desired image on the on the image-receiving layer of the light-sensitive material. The image-receiving layer of the light-sensitive material can be constructed in the same manner as the layer of the image-receiving material. The details of the image-receiving layer will be described later.

Examples and usage of the other auxiliary layers are also described in the above-mentioned publications and applications concerning the light-sensitive material.

The light-sensitive material of the invention can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

In preparation of the light-sensitive material, the polymerizable compounds are used as the medium for preparation of the liquid composition containing another component of the light-sensitive layer. For example, the silver halide (including the silver halide emulsion), the reducing agent, or the color image forming substance can be dissolved, emulsified or dispersed in the polymerizable compound to prepare the light-sensitive material. Especially, the color image forming substance is preferably incorporated into the polymerizable compound. Further, the necessary components for the preparation of microcapsules, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. The light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispersed state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The polymerizable compound (including the light-sensitive composition) is preferably emulsified in an aqueous medium to prepare the coating solution. The necessary components for preparation of the microcapsule, such as shell material can be incorporated into the emulsion. Further, other components such as the reducing agent can be added to the emulsion.

The emulsion of the polymerizable compound can be processed for forming the shell of the microcapsule. Examples of the process for the preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Pat. No. 990,443 and Japanese Patent Publication Nos. 38(1963)-19574, 42(1967)-466 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins hydroxypropyl cellulose or other wall-forming materials as described in U.S. Pat. No. 4,025,455; an in situ process utilizing polymerization of monomers as described in U.K. Patent No. 867,797 and U.S. Pat. No. 4,001,140; an electrolytic dispersion and cooling process as described in U.K. Pat. Nos. 952,807 and 965,074; a spray-drying process as described in U.S. Pat. No. 3,111,407 and U.K. Pat. No. 930,422; etc. It is preferable, though not limitative, that the microcapsule is prepared by emulsifying a core material containing the polymerizable compound and forming a polymeric membrane (i.e., shell) over the core materials.

When the emulsion of the polymerizable compound (including the dispersion of the microcapsule) has been prepared by using the light-sensitive composition, the emulsion can be used as the coating solution of the light-sensitive material. The coating solution can be also prepared by mixing the emulsion of the polymerizable compound and the silver halide emulsion.

A light-sensitive material of the invention can be prepared by coating and drying the above-prepared coating solution on a support in the conventional manner.

Use of the light-sensitive material is described below.

In the use of the light-sensitive material of the invention, a development process is conducted simultaneously with or after imagewise exposure.

Various exposure means can be employed in the image-wise exposure, and in general, the latent image of the silver halide is obtained by imagewise exposure to radiation including visible light. The type of light source and exposure conditions can be selected depending on the light-sensitive wavelengths determined by spectral sensitization or sensitivity of silver halide. The original image can be either monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149. The image forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means. The heating temperature for the development process usually ranges from 80° C. to 200° C., and preferably from 100° C. to 160° C. Various heating patterns are applicable. The heating time is usually from 1 second to 5 minutes, and preferably from 5 seconds to 1 minute.

During the above development process, a polymerizable compound in a portion where a latent image of the silver halide has been formed or in a portion where a latent image of the silver halide has not been formed is polymerized. In a general system, the polymerizable compound in a portion where the latent image has been formed is polymerized. If a nature or amount of the reducing agent is controlled, the polymerizable compound in a portion where the latent image has not been formed can be polymerized in the same manner as the light-sensitive material described in Japanese Patent Provisional Publication No. 61(1986)-260241.

In the above development process, a polymer image can be formed on the light-sensitive layer. A pigment image can be also obtained by fixing pigments onto the polymer image.

The image can be also formed on the image-receiving material. The image-receiving material is described hereinbelow. The image forming method employing the image-receiving material or the image-receiving layer is described in Japanese Patent Provisional Publication No. 61(1986)-278849.

Examples of the material employable as the support of the image-receiving material include baryta paper in addition to various examples which can be employed as the support of the known light-sensitive material.

The image-receiving material is usually prepared by providing the image-receiving layer on the support. The image-receiving layer can be constructed according to the color formation system. In the case that a polymer image is formed on the image-receiving material and that a dye or pigment is employed as the color image forming substance, the image-receiving material be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-sensitive layer is also employable in the image-receiving layer.

The image-receiving layer can be composed of two or more layers according to the above-mentioned functions. The thickness of the image-receiving layer preferably ranges from 1 to 100 $\mu$m, more preferably from 1 to 20 $\mu$m.

After the development process, by pressing the light-sensitive material on the image-receiving material to transfer the unpolymerized polymerizable compound to the image-receiving material, a polymer image can be obtained in the image-receiving material. The process for pressing can be carried out in various known manners.

In the case that the light-sensitive layer contains a color image forming substance, the color image forming substance is fixed by polymerization of the polymerizable compound. Then, by pressing the light-sensitive material in contact with the image-receiving material to transfer the color image forming substance in unfixed portion, a color image can be produced on the image-receiving material.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

COMPARISON EXAMPLE 1

Preparation of silver halide emulsion

In 1,000 ml of water were dissolved 20 g of gelatin and 1 g of potassium bromide, and the resulting gelatin solution was kept at 70° C. To the gelatin solution, 600 ml of an aqueous solution containing 70 g of potassium bromide and 600 ml of an aqueous solution containing 0.59 mole of silver nitrate were added simultaneously at the same feed rate over a period of 20 minutes. Further, after 5 mimutes, to the resulting mixture 100 ml of an aqueous solution containing 1.7 g of potassium iodide and 100 ml of an aqueous solution containing 0.01 mole of silver nitrate were added simultaneously at the same feed rate over a period of 3 minutes to obtain a silver iodobromide emulsion having uneven grain size distribution and an average grain size of 0.18 $\mu$m. The coefficient of variation of the grain size distribution of the silver halide grains was 32%.

The emulsion was washed for desalting and then subjected to chemical sensitization with 5 mg of sodium thiosulfate and 20 mg of 4-hydroxy-6-methyl-1,3,3a,7-tetraazaindene at 60° C. to obtain the silver halide emulsion (a). The yield of the emulsion was 600 g.

Preparation of silver benzotriazole emulsion

In 3,000 ml of water were dissolved 28 g of gelatin and 13.2 g of benzotriazole, and the solution was kept at 40° C. while stirring. To the solution was added 100 ml of an aqueous solution of 17 g of silver nitrate over 2 min. An excessive salt were sedimented by pH-adjustment and removed from the resulting emulsion. Thereafter, the emulsion was adjusted to pH 6.30 to obtain a silver benzotriazole emulsion. The yield of the emulsion was 400 g.

Preparation of light-sensitive composition

In 100 g of trimethylolpropane triacrylate were dissolved 0.2 g of the following copolymer, 10 g of Pargascript Red I-6-B (tradename of Lilia-Geigy) and 2 g of Emulex NP-8 (tradename, preduced by Nippon Emulsion Co., Ltd.).

(Copolymer)

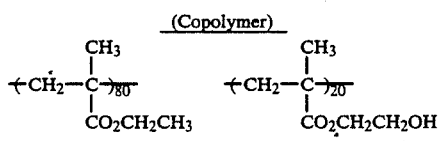

To 18 g of the resulting solution was added to a solution in which 0.2 g of the following reducing agent (I) and 0.6 g of the following reducing agent (II) were dissolved in 1.8 g of methylene chloride.

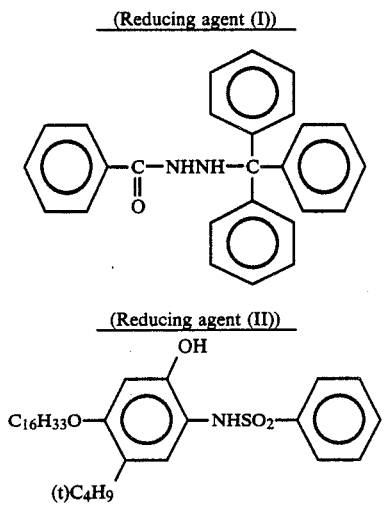

Further, to the resulting solution were added 2 g of the silver halide emulsion (a) and 2 g of the silver benzotriazole emulsion, and the mixture was stirred at 15,000 r.p.m. for 5 min. to obtain a light-sensitive composition.

Preparation of light-sensitive microcapsule

To the light-sensitive composition was dissolved 10 g of an adduct of xylylene diisocyanate and trimethylolpropane, (tradename "Takenate D110N" produced by Takeda Chemical Industries, Ltd.). The resulting solution was added to 70 g of 4% aqueous solution of methyl cellulose, and the mixture was stirred at 7,000 r.p.m. for 2 minutes to obtain an emulsion. The emulsion was subjected to reaction for 2 hours at 40° C. while stirring at 1,000 r.p.m. to obtain a dispersion containing light-sensitive microcapsules which have a shell material made of polyurea resin.

Preparation of light-sensitive material

To 10.0 g of the light-sensitive microcapsule dispersion were added 1.0 g of 10% aqueous solution of Emulex NP-8 (tradename, produced by Nippon Emulsion, Co., Ltd.) and 5 g of 5% aqueous solution of guanidine trichroloacetate to prepare a coating solution. The coating solution was uniformly coated on a cast-coat paper having a basis weight of 85 g using a coating rod to a wet thickness of 70 μm and dried at about 30° C. to obtain a light-sensitive material (A).

EXAMPLE 1

Preparation of silver halide emulsion

The silver emulsion (b) was prepared in the same manner as in Comparison Example 1, except that the gelatin solution was kept at 60° C. in place of 70° C., and to the gelatin solution, 600 ml of an aqueous solution containing 70 g of potassium bromide and 600 ml of an aqueous solution containing 0.59 mole of silver nitrate were added over a period of 40 minutes in place of 20 minutes.

Further, each of the silver halide emulsions (c) and (d) was prepared in the same manner except that the stirring rate and the mixing time were varried.

The coefficient of variation in the grain size distribution and the crystal habit of the silver halide grains in the above silver halide emulsions are set forth in Table 1.

TABLE 1

| Silver Halide Emulsion | Average Grain Size | Coefficient of Variation | Crystal Habit of Grain |
|---|---|---|---|
| (a) | 0.18 μm | 32 % | tetradecahedral |
| (b) | 0.18 μm | 18 % | tetradecahedral |
| (c) | 0.18 μm | 14 % | tetradecahedral |
| (d) | 0.18 μm | 9 % | tetradecahedral |

Preparation of light-sensitive material

The light-sensitive materials (B) to (D) were prepared in the same manner as in Comparison Example 1, except that the above silver halide emulsions (b) to (d) were used, respectively, in place of the silver halide emulsion (a).

Preparation of image-receiving material

To 125 g of water was added 11 g of 40% aqueous solution of sodium hexametaphosphate, and were further added 34 g of zinc 3,5-di-α-methylbenzylsalicylate and 82 g of 55% slurry of calcium carbonate, followed by coarsely dispersing in a mixer. The coarse dispersion was then finely dispersed in Dynomile dispersing device. To 200 g of the resulting dispersion were added 6 g of 50% latex of SBR (styrene-butadiene rubber) and 55 g of 8% aqueous solution of polyvinyl alcohol, and the resulting mixture was made homogenous.

The mixture was then uniformly coated on an art paper having basis weight of 43 g/m² to give a layer having a wet thickness of 30 μm and dried to obtain an image-receiving material.

Evaluation of light-sensitive material

Each of the light-sensitive materials prepared in Comparison Example 1 and Example 1 was imagewise exposed to light through a filter (wedge) in which the density continuously changed, using a tungsten lamp at 2,000 lux for 1 second and then heated on a hot plate at 125° C. for 10 to 50 seconds. Each of the exposed and heated light-sensitive materials was then combined with the image-receiving material and passed through press rolls under pressure of 350 kg/cm² to obtain a magenta positive image on the image receiving material. The density of the obtained image was measured using Macbeth reflection densitometer.

The results are set forth in Table 2. In Table 2, "Contrast in Image" means the obtained maximum contrast value ("maximum density" - "minimum density") concerning each of the light-sensitive material, and "Heating Time" means the time required to obtain the above maximum contrast.

TABLE 2

| Light-Sensitive Material | Silver Halide Emulsion | Contrast in Image | Heating Tome |
|---|---|---|---|
| (A) | (a) | 0.72 | 14 seconds |
| (B) | (b) | 0.96 | 12 seconds |
| (C) | (c) | 1.01 | 10 seconds |
| (D) | (d) | 1.04 | 10 seconds |

It is apparent from the results in Table 2 that each of the light-sensitive materials (B), (C) and (D) forms a clear positive image which has a high maximum density and a low minimum density. It is also apparent that the clear image was obtained in the short-time development.

COMPARISON EXAMPLE 2

Preparation of silver halide emulsion

The silver halide emulsion (a') was prepared in the same manner as in Comparison Example 1, except that the emulsion was not subjected to chemical sensitization with 5 mg of sodium thiosulfate and 20 mg of 4-hydroxy-6-methyl-1,3,3a,7-tetraazaindene.

Preparation of light-sensitive material

The light-sensitive material (E) was prepared in the same manner as in Comparison Example 1, except that the above silver halide emulsion (a') was used in place of the silver halide emulsion (a).

EXAMPLE 2

Preparation of silver halide emulsion

Each of the silver halide emulsions (b') to (d') was prepared in the same manner as in Example 1, except that each of the emulsions was not subjected to chemical sensitization with 5 mg of sodium thiosulfate and 20 mg of 4-hydroxy-6-methyl-1,3,3a,7-tetraazaindene.

Preparation of light-sensitive material

Each of the light-sensitive materials (F) to (H) was prepared in the same manner as in Example 1, except that each of the above silver halide emulsions (b') to (d') was respectively used in place of each of the silver halide emulsions (b) to (d).

Evaluation of light-sensitive material

Each of the light-sensitive materials prepared in Comparison Example 2 and Example 2 was evaluated in the same manner as in Comparison Example 1 and Example 1. The density of each of the obtained image on the image-receiving material was measured using Macbeth reflection densitometer.

The results are set forth in Table 3. In Table 3, "Contrast in Image" and "Heating Time" have the same meanings in Table 2.

TABLE 3

| Light-Sensitive Material | Silver Halide Emulsion | Contrast in Image | Heating Time |
|---|---|---|---|
| (E) | (a') | 0.86 | 14 seconds |
| (F) | (b') | 0.99 | 13 seconds |
| (G) | (c') | 1.08 | 11 seconds |
| (H) | (d') | 1.07 | 11 seconds |

It is apparent from the results in Table 3 that in a system employing no chemical sensitization, the light-sensitive material of the invention gives a clear image in the short-time development.

COMPARISON EXAMPLE 3

Preparation of light-sensitive material

The light-sensitive material (I) was prepared in the same manner as in Comparison Example 2, except that the silver benzotriazole emulsion was not used.

EXAMPLE 3

Preparation of light-sensitive material

Each of the light-sensitive materials (J) to (L) was prepared in the same manner as in Example 2, except that the silver benzotriazole emulsion was not used.

Evaluation of light-sensitive material

Each of the light-sensitive materials prepared in Comparison Example 3 and Example 3 was evaluated in the same manner as in Comparison Example 1 and Example 1. The density of each of the obtained image on the image-receiving material was measured using Macbeth reflection densitometer.

The results are set forth in Table 4. In Table 4, "Contrast in Image" and "Heating Time" have the same meanings in Table 2.

TABLE 4

| Light-Sensitive Material | Silver Halide Emulsion | Contrast in Image | Heating Time |
|---|---|---|---|
| (J) | (a') | 0.88 | 20 seconds |
| (K) | (b') | 1.02 | 18 seconds |
| (L) | (c') | 1.0 | 17 seconds |
| (M) | (d') | 1.10 | 15 seconds |

It is apparent from the results in Table 4 that in a system employing no organic silver salt (silver benzotriazole), the light-sensitive material of the invention gives a clear image in the short-time development.

COMPARISON EXAMPLE 4

Preparation of light-sensitive material

The light-sensitive material (M) was prepared in the same manner as in Comparison Example 3, except that 1 g of the silver halide emulsion (a') was used in place of 2 g of the silver halide emulsion (a').

EXAMPLE 4

Preparation of light-sensitive material

Each of the light-sensitive materials (N) to (P) was prepared in the same manner as in Example 3, except that 1 g of each of the silver halide emulsion (b') to (d') was respectively used in place of 2 g of each of the silver halide emulsion (b') to (d').

Evaluation of light-sensitive material

Each of the light-sensitive materials prepared in Comparison Example 4 and Example 4 was evaluated in the same manner as in Comparison Example 1 and Example 1. The density of each of the obtained image on the image-receiving material was measured using Macbeth reflection densitometer.

The results are set forth in Table 5. In Table 5, "Contrast in Image" and "Heating Time" have the same meanings in Table 2.

TABLE 5

| Light-Sensitive Material | Silver Halide Emulsion | Contrast in Image | Heating Time |
|---|---|---|---|
| (M) | (a') | 0.43 | 23 seconds |
| (N) | (b') | 0.81 | 19 seconds |
| (O) | (c') | 0.89 | 18 seconds |
| (P) | (d') | 0.98 | 16 seconds |

It is apparent from the results in Table 5 that even if the amount of the silver halide emulsion is small, the light-sensitive material of the invention gives a clear image in the short-time development.

I claim:

1. A light-sensitive material comprising a support and a light-sensitive layer containing silver halide grains, a reducing agent, an ethylenically unsaturated polymerizable compound, wherein the silver halide grains and polymerizable compound are contained in microcapsules which are dispersed in the light-sensitive layer, said silver halide grains having such a grain size distribution that the coefficient or variation in terms of $\sigma/\bar{r}$ is not more than 20%, wherein $\sigma$ means a standard deviation of the grain size and $\bar{r}$ means an average grain size, and said polymerizable compound being contained in microcapsules in an amount of 5 to $1.2 \times 10^5$ times by weight as much as the amount of the silver halide grains.

2. The light-sensitive material as claimed in claim 1, wherein the coefficient of variation of the silver halide grains is not more than 15%.

3. The light-sensitive material as claimed in claim 1, wherein the average grain size of the silver halide grains is in the range of from 0.001 to 5 μm.

4. The light-sensitive material as claimed in claim 1, wherein the total silver content in the light-sensitive layer is in the range of from 0.1 mg/m$^2$ to 10 g/m$^2$.

5. The light-sensitive material as claimed in claim 1, wherein the light-sensitive layer further contains a color image forming substance.

6. The light-sensitive material as claimed in claim 1, wherein the average grain size of the silver halide is not more than one-fifth of the average size of the microcapsules.

7. An image-forming method which comprises:
imagewise exposing a light-sensitive material comprising a support and a light-sensitive layer containing silver halide grains, a reducing agent, an ethylenically unsaturated polymerizable compound, wherein the silver halide grains and polymerizable compound are contained in microcapsules which are dispersed in the light-sensitive layer, said silver halide grains having such a grain size distribution that the coefficient or variation in terms of $\sigma/\bar{r}$ is not more than 20%, wherein $\sigma$ means a standard deviation of the grain size and $\bar{r}$ means an average grain size, and said polymerizable compound being contained in microcapsules in an amount of 5 to $1.2 \times 10^5$ times by weight as much as the amount of the silver halide grains, to form a latent image of the silver halide; and
simultaneously or thereafter heating the light-sensitive material to polymerize the polymerizable compound within the area where the latent image of the silver halide has been formed.

8. The image-forming method as claimed in claim 7, wherein after heating the light-sensitive material, the light-sensitive material is pressed on an image-receiving material to transfer the obtained image to the image-receiving material.

9. The image-forming method as claimed in claim 7, wherein the total silver content in the light-sensitive layer of the light-sensitive material is in the range of from 0.1 mg/m$^2$ to 10 g/m$^2$.

10. An image-forming method which comprises:
imagewise exposing a light-sensitive material comprising a support and a light-sensitive layer containing silver halide grains, a reducing agent, an ethylenically unsaturated polymerziable compound, wherein the silver halide grains and polymerizable compound are contained in microcapsules which are dispersed in the light-sensitive layer, said silver halide grains having such a grain size distribution that the coefficient or variation in terms of $\sigma/\bar{r}$ is not more than 20%, wherein $\sigma$ means a standard deviation of the grain size and $\bar{r}$ means an average grain size, and said polymerizable compound being contained in microcapsules in an amount of 5 to $1.2 \times 10^5$ times by weight as much as the amount of the silver halide grains, to form a latent image of the silver halide; and
simultaneously or thereafter heating the light-sensitive material to polymerize the polymerizable compound within the area where the latent image of the silver halide has not been formed.

11. The image-forming method as claimed in claim 10, wherein after heating the light-sensitive material, the light-sensitive material is pressed on an image-receiving material to transfer the obtained image to the image-receiving material.

12. The image-forming method as claimed in claim 10, wherein the total silver content in the light-sensitive layer of the light-sensitive material is in the range of from 0.1 mg/m$^2$ to 10 g/m$^2$.

13. The light-sensitive material as claimed in claim 1, wherein the silver halide grains are arranged in a shell of the microcapsule, and the polymerizable compound is arranged in a core of the microcapsule.

14. The light-sensitive material as claimed in claim 1, wherein the reducing agent is contained in the microcapsules.

* * * * *